United States Patent

Hill

[15] 3,649,926

[45] Mar. 14, 1972

[54] BIAS CIRCUITRY FOR A DIFFERENTIAL CIRCUIT UTILIZING COMPLEMENTARY TRANSISTORS

[72] Inventor: Lorimer K. Hill, Cupertino, Calif.

[73] Assignee: Texas Instruments Incorporated, Dallas, Tex.

[22] Filed: Jan. 8, 1970

[21] Appl. No.: 1,511

[52] U.S. Cl. ................................330/30 D, 330/13, 330/69

[51] Int. Cl. ................................H03f 3/68

[58] Field of Search ..................330/13, 17, 18, 30, 30 D, 22, 330/40, 69

[56] References Cited

UNITED STATES PATENTS

| | | | |
|---|---|---|---|
| 3,261,988 | 7/1966 | Johnson | 330/69 X |
| 3,440,554 | 4/1969 | McGraw et al. | 330/18 X |

*Primary Examiner*—Roy Lake
*Assistant Examiner*—Lawrence J. Dahl
*Attorney*—James O. Dixon, Andrew M. Hassell, Melvin Sharp, Henry T. Olsen, Michael A. Sileo, Jr., John E. Vandigriff and Harold Levine

[57] ABSTRACT

A differential circuit is disclosed which utilizes opposed pairs of complementary active electronic control devices. Bias circuitry, including a generally constant current source, controls the bias characteristics of the control devices to provide a wide range of differential operation.

15 Claims, 5 Drawing Figures

Figure 2A:
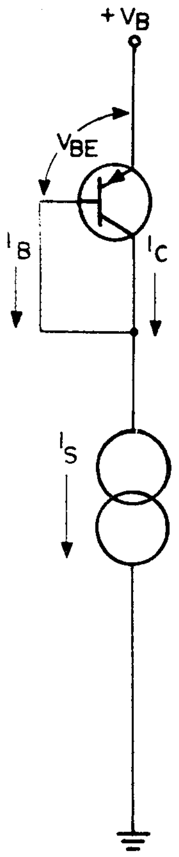

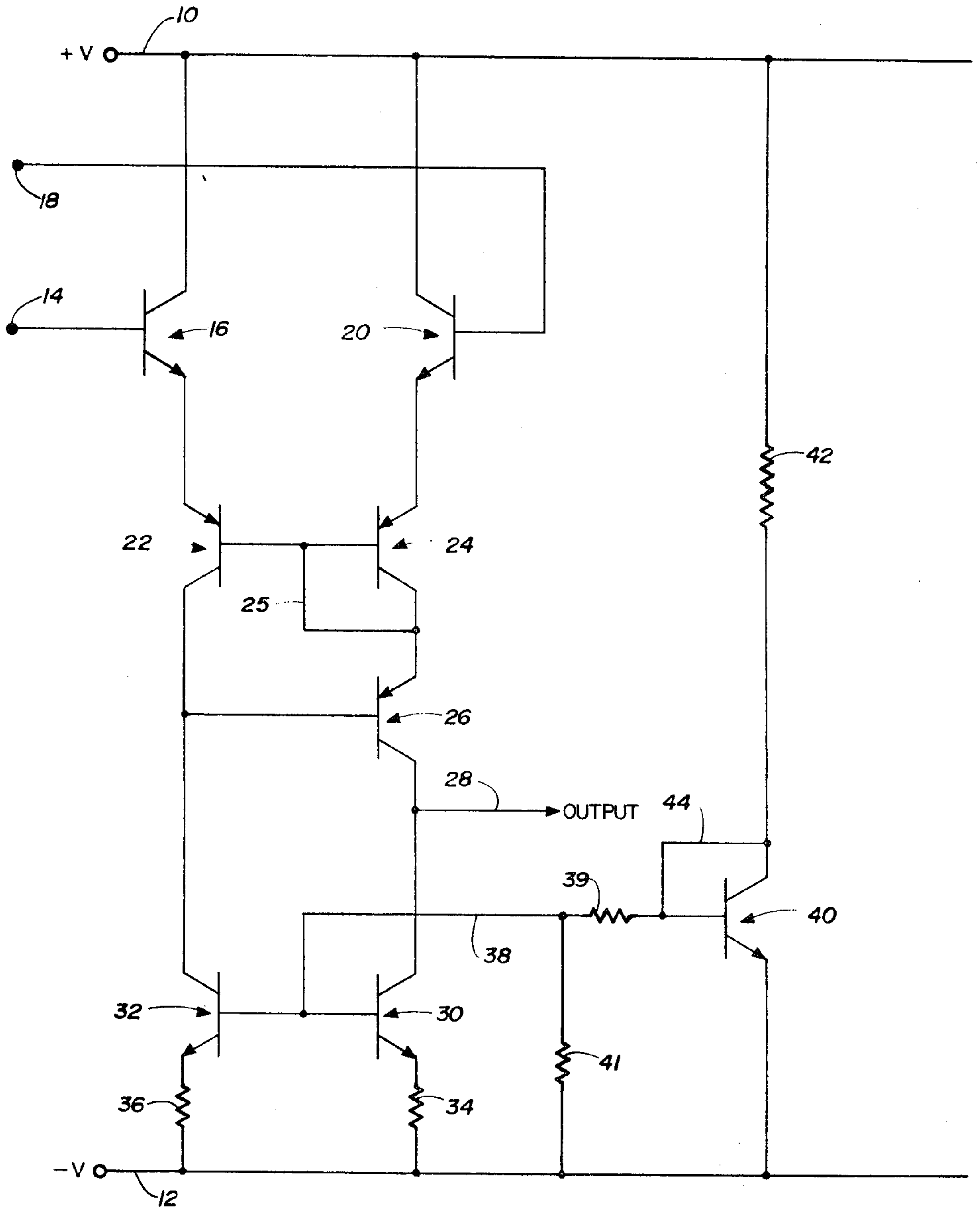
FIG. I
INVENTOR
LORIMER K. HILL

INVENTOR
LORIMER K. HILL

BIAS CIRCUITRY FOR A DIFFERENTIAL CIRCUIT UTILIZING COMPLEMENTARY TRANSISTORS

This invention relates to differential circuits, and more particularly to biasing circuitry for differential circuits utilizing opposed pairs of complementary transistors.

The complementary configuration of NPN and PNP transistors has been found advantageous for use with differential operational amplifiers due to their desirable characteristics of low offset voltage, low offset current, low input current, low thermal drift, and immunity to supply voltage variations. In such complementary configurations, the input variations of one active device are cancelled by the matched equivalent to give offset and temperature characteristics dependent only on the degree to which the devices are matched. It has, however, been necessary in previously developed complementary transistor differential amplifiers to provide somewhat complicated and expensive biasing circuitry therefor.

For instance, one type of biasing technique has heretofore utilized a feedback loop to vary the bias voltage level applied to the bases of PNP-type transistors connected in the differential configuration. An example of this previously developed biasing technique is incorporated in the circuit known as the $\mu$A741 Operational Amplifier manufactured and sold by the Fairchild Semiconductor Corporation. Other types of bias networks have also been developed wherein the bias voltage applied to the differential connected complementary transistor circuit is dependent upon the varying $h_{FE}$ of the differentially connected PNP transistors. An example of such a circuit is entitled the LM101 Operational Amplifier manufactured and sold by the National Semiconductor Corporation.

In accordance with the present invention, a biasing circuit is provided for a complementary transistor differential stage which includes a transistor connected in series with one of the pairs of complementary transistors. The transistor has a base which is coupled to the other pair of complementary transistors. A generally constant current source is connected to establish a predetermined current flow through one pair of the complementary transistors. Variations in the input voltage applied across the opposed pairs of the complementary transistors is then reflected in the output of the transistor.

In accordance with a more specific aspect of the invention, a first set of transistors of opposite conductivity type are connected in a complementary series configuration to receive a first input signal. A second set of transistors of opposite conductivity type are connected in a complementary series configuration to receive a second input signal, the bases of one pair of transistors in the first and second set being commonly connected. The base of one of the transistors is tied to the output electrode of the transistors for operation in a diode mode. A fifth transistor is connected in series with the second set of transistors and includes a base electrode coupled to the first set of transistors. A circuit is connected to bias the first set of transistors such that a predetermined generally constant current flow is established therethrough. An output terminal is connected to the output electrode of the fifth transistor such that variations between the first and second input signals create differential changes in the current flow from the output electrode of the fifth transistor.

Figure 2B:
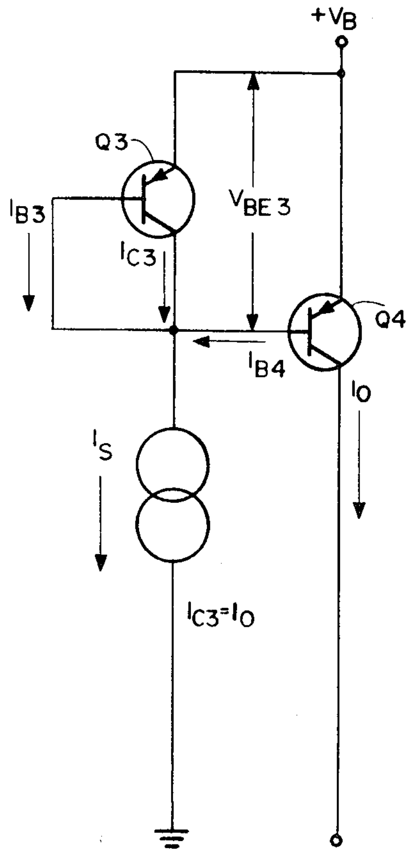
Figure 2C:
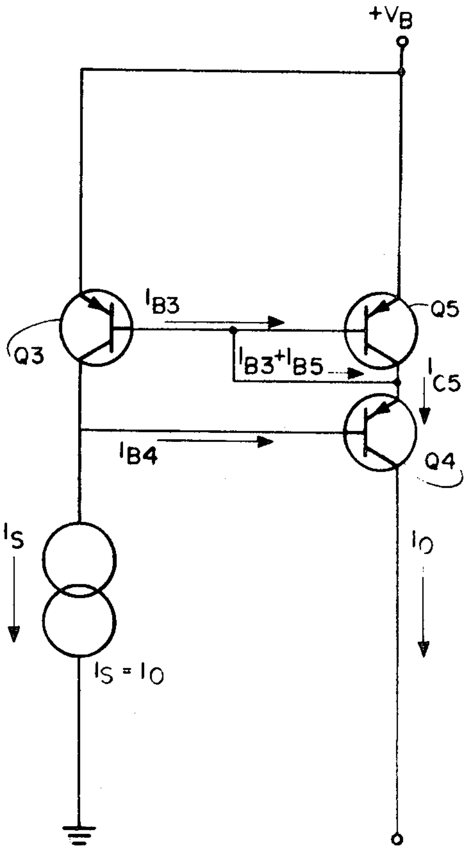
Figure 3:
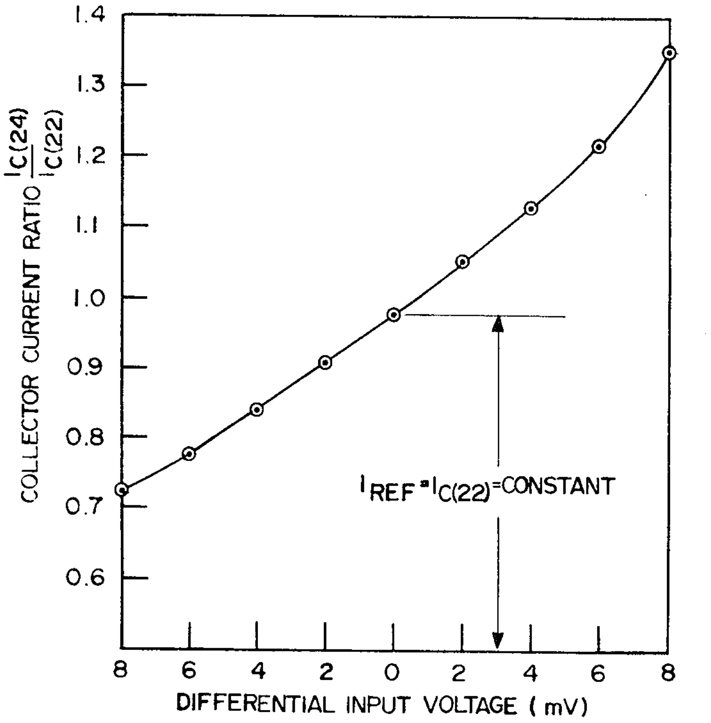

For a more complete understanding of the present invention and for further objects and advantages thereof, reference is now made to the following description taken in conjunction with the accompanying drawings, in which:

FIG. 1 is a circuit diagram of the preferred embodiment of the invention;

FIGS. 2*a–c* are somewhat diagrammatic simplified circuit diagrams illustrating the operation of the device; and FIG. 3 is a graph of the differential voltage versus the collector current ratio of the present circuit.

Referring to the circuit shown in FIG. 1, a positive bias voltage is applied at the terminal 10, while a negative voltage bias is applied to the circuit at the terminal 12. A first input signal is fed to the circuit via a terminal 14 which is connected to the base of a NPN-type transistor 16. A second input signal is applied to the circuit at the terminal 18 which is connected to the base of NPN-transistor 20. The collector of the transistor 16 is connected to the source of positive voltage, while the emitter thereof is directly coupled to the emitter of a PNP-transistor 22. The collector of the transistor 20 is also connected to the source of positive voltage, with its emitter being directly connected to the emitter of a PNP-transistor 24. The bases of transistors 22 and 24 are directly coupled, with the base and collector of transistor 24 being tied together by a conductor 25. Transistors 16 and 22 thus form a first set of complementary transistors which are connected in a differential configuration with a second set of complementary transistors comprising transistors 20 and 24.

A PNP-transistor 26 is connected at its emitter to the collector of transistor 24. The base of transistor 26 is tied to the collector of transistor 22, with the collector of transistor 26 being tied to an output terminal 28. The collector of transistor 26 is also tied to the collector of a NPN-transistor 30. A NPN-transistor 32 is connected at its collector to the collector of transistor 22, with the bases of transistors 30 and 32 being directly connected. The emitter of transistor 30 is tied by way of a resistor 34 to the source of negative potential. The emitter of transistor 32 is coupled by way of resistor 36 also to the source of negative potential.

The commonly connected bases of transistors 30 and 32 are tied by way of conductor 38 and resistor 39 to the base of a NPN-transistor 40. A resistor 41 is tied between conductor 38 and the source of negative potential. The collector of transistor 40 is connected through a resistor 42 to the source of positive voltage. The base and collector of transistor 40 are tied together by a conductor 44 in a diode configuration. The emitter of transistor 40 is directly coupled to the negative source of voltage potential.

An important aspect for optimum operation of the present circuit is that operating parameter of certain of the transistors be matched. For instance, it is important that transistors 22 and 24 have generally matched parameters such as $V_{BE}$, $f_T$ and $h_{FE}$. Similarly, transistors 30, 32 and 40 preferably have matched operating parameters such as $V_{BE}$, $f_T$, and $h_{FE}$. While transistors have been disclosed in the preferred embodiment of the invention, it will be understood that in some instances it may be desirable to utilize other active electronic control devices such as FET devices, vacuum tube devices or the like. It will also be understood that the transistor types utilized in the present circuit may be reversed upon the reversal of polarity of the biasing voltages.

The present circuit utilizes a simplified biasing technique which allows for operation of the present circuit without requirements of complicated feedback loops or the like. The stage illustrated in FIG. 1, when coupled with suitable output circuitry, will feature low offset, high input impedance, high open-loop gain, low power consumption, internal frequency compensation for closed-loop stability, and for output voltage swings required for positive threshold-detector triggering. This circuit is designed for good temperature stability and operation over a wide range of supply voltages with little degradation in amplifier performance.

The present circuit is particularly adapted for fabrication as a miniaturized integrated circuit. For example, both pairs of the complementary transistors of the present circuit may be formed in accordance to the disclosure of U.S. Pat. application, Ser. No. 650,303, entitled "Process for Fabricating Monolithic Circuits Having Matched Complementary Transistors and Products," filed June 30, 1967.

Low input bias currents and high input impedances are realized by operating the differential input transistors 16 and 20 at very low collector currents. In integrated circuits, the input stage transistors can be easily matched over several decades of collector current by making the devices identical structures and physically locating them close together on the silicon die. The problem then becomes one of obtaining low collector currents, which in I–C fabrication is normally somewhat prohibitive due to size and cost considerations for fabricating high resistances. A unique feature of the present circuit is the current source for the emitters of input transistors 16 and 20. This design makes use of highly predictable emitter-base voltage characteristics of identical transistors operating at equal collector currents to form microampere current sources using resistances 39 and 41 of only a few kilohoms.

The bias current for the input transistor stage 16 and 20 is obtained by imposing the voltage developed from the resistive bias string 39 and 41 across the base-emitter junction of 30 and 32. If transistors 30 and 32 are generally identical, as will be the case for the I–C design, their collector currents will also be generally equal. Hence, the operating current of the differential pair will be determined by the resistor divider network and the bias voltage developed across the diode connected transistor 40.

The bias voltage for the circuit is developed across the base-emitter junction of transistor 40, which is in turn established by the supply voltage termed $V_{CC}$, and resistor 42. The relationship of the voltages of the circuit can be determined from the expression $$V_{BE} = (kT/q)ln(I_C/I_s) \qquad (1)$$

Wherein:

$I_S$ = saturation current $q$ = charge of an electron $T$ = absolute temperature, and $I_C$ = collector current.

The $V_{BE}$ of transistor 40 may thus be termed $$V_{BE(40)} = (kT/q)ln(V_{CC}/(R42)I_s) \qquad (2)$$

Wherein:

R42 = resistance of resistor 42.

The collector currents of transistors 30 and 32 are then given by $$I_{C(30)} = I_{C(32)} = I_s\, e\, (q\, V_{BE}/kT) \qquad (3)$$

Where $$V_{BE(30)} = V_{BE(32)} = V_{BE(40)}\, R_{41}/(R_{39}+R_{41}) \qquad (4)$$

From equations (1), (2) and (3), $$\frac{kT}{q} \ln \frac{I_{C(32)}}{I_s} = \frac{kT}{q} \ln \left[ \frac{\frac{V_{CC}}{+R42}}{I_s} \left( \frac{R41}{R39+R41} \right) \right] \qquad (5)$$

Equation (5) shows that the collector currents of transistors 30 and 32 are independent of temperature variations and dependent only on supply voltage and resistance values of resistors 39, 41 and 42. Experience has shown that such a bias scheme can be made stable over a wide temperature range, giving collector current matches between transistors 30 and 32 typically better than 5 percent.

An important feature of this stage employs transistors 22, 24 and 26 in a current source arrangement to provide improved bias current balance for the input-stage transistors 16 and 20 and to provide very high resistance values used in conjunction with small capacitor values obtainable in I–C networks to form a frequency compensation network for feedback stabilization without the need for external compensation. In addition, the circuit provides a method of conversion from a balanced condition to a single-ended output to further simplify the design.

Operation of the circuit may be best understood by first considering the simplified circuits of FIGS. *2a–c*. It will be assumed that all transistors in the circuits are matched. The collector base junction of Q3 is supplied by a current source $I_s$. The current distribution of $I_s$ between $I_C$ and $I_B$ will depend on the particular device used for Q3, but the summation of $I_C$ and $I_B$ will always equal to $I_s$. If the current is limited to values in which the contact and base spreading resistance is unimportant and leakage currents have little effect, a voltage is developed across the base-emitter junction of Q3 which can be determined from the expression of equation (1), $$V_{BE(3)} = (kT/q)\ ln\ (I_{C(3)}/I_{sat(3)}) \qquad (6)$$

If the $V_{BE(3)}$ voltage is developed across the base-emitter junction of a second transistor Q4, FIG. *2b*, a current source is developed through Q4 to supply a collector current $I_o$. If identical devices for Q3, and Q4 are assumed, the collector current $I_O$ of Q4 will be equal to the collector current $I_{C(3)}$ of Q3 and $I_O \neq I_s$. For the balanced conditions of a differential input, it is desirable that $I_s = I_O$. This condition is obtained by employing a third transistor device Q5, and rearrangement of the basic circuit, FIG. *2c*. The conditions of FIGS. *2a–b* will also apply. The collector current $I_{C(3)}$ and $I_{B(4)}$ must equal the bias current $I_s$ and the current distribution of $I_{C(3)}$ and $I_{B(4)}$ will again depend on the matched characteristics of the transistors. Therefore, the current $I_{B(4)}$ will be approximately equal to $I_{B(3)}$.

The voltage developed across the base-emitter junction of Q3 will be imposed across the base-emitter junction of Q5, which in accordance with equation (1) gives rise to a collector current $I_{C(5)}$ and base current $I_{B(5)}$. For identical transistors, Q3 and Q5, collector current $I_{C(5)}$ will equal collector current $I_{C(3)}$. The collector and base current of Q5 and the base current of Q3 will be supplied by transistor Q4 and will be equal to the base current $I_{B(4)}$ and collector current $I_O$. Since $I_{B(3)} \cong I_{B(4)}$, $$I_O = I_{C(5)} + I_{B(5)} \qquad (7)$$

$$= I_{C(3)} + I_{B(3)} \qquad (8)$$

$$= I_{C(3)} + I_{B(4)} \qquad (9)$$

and $$I_O = I_s \qquad (10)$$

Thus, the desired condition is achieved through matching of Q3 and Q5.

When the circuit shown in FIG. *2c* is related to the circuit of FIG. 1, transistors Q3, Q4 and Q5 will be seen to correspond as a group with transistors 22, 24 and 26. Thus for quiescent bias conditions and $V_{B(16)} = V_{B(20)}$, the current source transistor 32 establishes the collector current of Q3; the collector current of Q3 regulates the collector current of Q5 and balanced currents for the input stage transistors Q1 and Q2 are obtained.

For dynamic operation where the base voltages at the input transistors 16 and 20, FIG. 1, become unbalanced, again consider the familiar expression of equation (1). A voltage differential at the input is transferred by transistor action to the emitters of transistors 22 and 24. Equation (1) thus expresses the voltage differential of the emitter-base junction of these two devices and consequently the collector and base currents of each transistor, since the base voltage potential of transistors 22 and 24 are equal.

From equation (7), $$V_{BE(22)} - V_{BE(24)} = (kT/q)ln(I_{C(22)}/I_{s(22)}) - (kT/q)ln\ I_{C(24)}/I_{s(24)} \qquad (11)$$

and, $$\Delta V_{BE} = (kT/q)ln\ (I_{C(22)}/I_{C(24)}) + (kT/q)\ ln\ (I_{s(24)}/I_{s(22)}) \qquad (12)$$

For equal collector currents, $I_{C(22)} = I_{C(24)}$, equation (12) becomes $$\Delta V_{BE} = (kT/q)\ ln\ (I_{s(22)}/I_{s(24)}) \qquad (13)$$

Testing of the present circuit has shown that for identical integrated transistors located physically close that $\Delta V_{BE}$ of Equation (13) is typically less than 0.5 mV. Furthermore, $\Delta V_{BE}$ is independent of current level enough that the emitter-base voltage differential of adjacent integrated circuit transistors 22 and 24 operating at different collector currents can be expressed by $$\Delta V_{BE} \cong (kT/q)\ ln\ (I_{C(22)}/I_{C(24)}) \qquad (14)$$

Rearranging Equation (14)

$$(I_{C(22)}/I_{C(24)}) = e^{q/kT}\,[V_{BE(22)} - V_{BE(24)}] \qquad (15)$$

The collector and base current of transistor 22 is established by the constant current source transistor 40, and therefore the emitter-base voltage $V_{BE(22)}$ of transistor 22 is essentially a constant regardless of the voltage potential placed at the base of transistor 16. Any change in the input voltage potential of the base of transistor 16 is, however, reflected across the emitter-base junction of transistor 24 because the voltage at the base of transistor 20 is held constant. A change in the emitter-base voltage of transistor 24 in turn causes a change in the collector current thereof. Similarly, any change in bias voltage of the base of transistor 20 with the voltage applied to transistor 16 held constant will cause the collector current of transistor 24 to vary in accordance with equation (15). Rearranging equation (15)

$$I_{C(24)} = I_{C(22)}\, e^{\frac{-q}{kT}}\,[V_{BE(22)} - V_{BE(24)}] \qquad (16)$$

$$= Ke^{-q/kT}(V_{BE(22)} - \{V_{BE(22)} - [V_{B(16)} - V_{B(20)}]\}) \quad (17)$$

$$= Ke \frac{q\Delta V_{IN}}{kT} \quad (18)$$

Wherein it is assumed that the input voltages are distributed equally across the input transistors and where:

$K = I_{C(22)}$ and $I_{C(22)}$ is constant and fixed by current source transistor 30, $V_{IN}$ = Differential voltage between the base of input transistors 16 and 20 and can be positive or negative.

From equation (18) a plot of the collector current ratio $I_{C(24)}/I$versus the differential input voltages of transistors 16 and 20 is shown in FIG. 3. With the collector current of transistor 24, a corresponding base current $I_{B(24)}$ is developed such that the summation of these two currents is equal to the collector current of transistor 26.

From Equation (7)

$$I_{C(26)} = I_{C(24)} + I_{B(24)} \quad (19)$$

FIG. 3, therefore, is also representative of the collector current ratio $$(I_{C(26)}/I_{C(22)}) = (I_O/I_R) \quad (20)$$

Thus, the circuit configuration consisting of transistors 22, 24 and 26 is very useful in providing balanced bias currents to the input stage transistors and in transforming the differential input to a single-end connection to further simplify the I–C design, as well as providing the desirable impedance levels required for internal frequency stabilization.

Whereas the present invention has been described with respect to a specific embodiment thereof, it will be understood that various changes and modifications may be suggested to one skilled in the art, and it is intended to encompass those changes and modifications as fall within the scope of the appended claims.

What is claimed is:

1. A differential circuit comprising:

input circuit means for coupling input signals to said differential circuit, a pair of active electronic control devices each connected to said input circuit means for respectively receiving said input signals and having commonly connected control electrodes, a third electronic control device connected in series with one of said pair of control devices, said third device having a control electrode coupled to the other of said control devices and having an output electrode, output circuit means connected to said third electronic control device for producing an output signal that proportionally varies with respect to the absolute difference between said input signals, bias circuit means for establishing a substantially constant current flow of predetermined magnitude through one of said pair of control devices, whereby differential changes in the input signals applied to said circuit means will proportionally produce differential changes in the current flow through the other of said pair of control devices and produce a proportional variation in the output signal on said output electrode of said third control device.

2. The circuit of claim 1 wherein said active electronic control devices comprise transistors.

3. The circuit of claim 1 wherein said pair of electronic control devices comprises:

first and second PNP-type transistors having commonly connected bases, the base and collector of said second transistor being coupled together, said third electronic control device comprising a third PNP-type transistor having an emitter connected to the collector of said second transistor and a base connected to the collector of said first transistor.

4. The circuit of claim 3 and further comprising:

NPN-type transistors connected in series with said first and second transistors and having bases for receiving said input signals.

5. The circuit of claim 1 wherein said bias means comprises:

a transistor connected in series with said one of said pairs of control devices and having a base connected to a voltage source.

6. The differential circuit utilizing complementary transistors comprising:

a first set of transistors of opposite conductivity type connected in a complementary series configuration for receiving a first input signal, a second set of transistors of opposite conductivity type connected in a complementary series configuration for receiving a second input signal, with the base electrodes of like ones of transistors in one of said first and second sets being commonly connected, and with the base electrode of one of said like transistors being tied to its output electrode, a fifth transistor connected in series with said second set and having a base electrode coupled to said first set, biasing circuit means for biasing said first set such that a predetermined current flow is established therethrough, output circuit means connected to the output electrode of said fifth transistor, and load circuit means connected to the output electrode of said fifth transistor such that variation between said first and second input signals create differential changes in the current flow from the output electrode of said fifth transistor.

7. The differential circuit of claim 6 wherein said biasing circuit means comprises:

a transistor having its collector and emitter electrodes connected in series with said first set and having a base electrode connected to a voltage source means.

8. The differential circuit of claim 7 wherein said voltage source means comprises a transistor connected in a diode configuration and connected to a voltage supply.

9. The differential circuit of claim 6 and further comprising:

a positive voltage source connected to one electrode of said first and second set of transistors, and a negative voltage source connected to said biasing circuit means and to said load circuit means.

10. The differential circuit of claim 6 wherein said load circuit means comprises a transistor having its collector and emitter electrodes connected in series with said second set and a base electrode connected to said biasing circuit means.

11. The differential circuit of claim 6 wherein said transistors have matched operating parameters.

12. In a transistor circuit the combination comprising:

a. first and second input circuit means connected to receive input signals;

b. first and second transistors of one conductivity type having commonly connected base electrodes, each of said transistors connected to one of said input terminal means, with said second transistor having its base electrode connected to its collector electrode;

c. a third transistor of said one conductivity type connected in series with said second transistor having its base electrode connected to said first transistor;

d. output circuit means connected to the collector electrode of said third transistor whereby differential voltage variation between said first and second input circuit means will create proportional changes in the current flow from the collector electrode of said third transistor;

e. a second set of transistors of opposite conductivity type having commonly connected bases, and being respectively connected in series to the collector electrodes of said first and third transistors;

f. bias circuit means connected to said common bases of said second set of transistors, whereby a substantially constant predetermined current flow is maintained through the first transistor of said first set.

13. The transistor circuit of claim 12 wherein said first and second input circuit means each comprise a transistor of opposite conductivity type and are respectively connected in series with said first and second transistors and have a base electrode for receiving said input signals.

14. The transistor circuit of claim 12 and further comprising:

a. a positive voltage source coupled to said first and second set of transistors, and b. a negative voltage source connected to said biasing circuit means and to said second set of transistors.

15. The transistor circuit of claim 14 wherein said bias circuit means comprises:

a. a resistor divider network connected between said positive and negative voltage sources, and b. a transistor having common base and collector electrodes and being connected between said resistor divider and said negative voltage source.

* * * * *